United States Patent [19]
Yoshida et al.

[11] 3,999,143
[45] Dec. 21, 1976

[54] PULSE WIDTH MODULATED SIGNAL AMPLIFIER
[75] Inventors: Tadao Yoshida; Tadao Suzuki, both of Tokyo, Japan
[73] Assignee: Sony Corporation, Tokyo, Japan
[22] Filed: Dec. 16, 1975
[21] Appl. No.: 641,243
[30] Foreign Application Priority Data
Dec. 20, 1974 Japan .......................... 49-146424
[52] U.S. Cl. .............................. 330/207 A; 330/10
[51] Int. Cl.² ......................................... H03F 3/38
[58] Field of Search .......... 330/10, 207 A; 329/106
[56] References Cited
UNITED STATES PATENTS
3,585,517 6/1971 Herbert ............................... 330/10

Primary Examiner—James B. Mullins
Attorney, Agent, or Firm—Lewis H. Eslinger; Alvin Sinderbrand

[57] ABSTRACT

A pulse width modulated signal amplifier includes a pair of transistors, each having a base, an emitter, and a collector. The bases are supplied with a pulse width modulated signal to be amplified, and the emitters are connected to each other and to an output terminal. A low pass filter connects the output terminal to a load. The collectors are connected to first and second terminals of a DC power source through first and second DC voltage sources, respectively, and first and second diodes are connected between the connection point of the emitters and corresponding terminals of the DC power source, respectively. First and second voltage limiting circuits are provided between the bases of the first and second transistors and corresponding terminals of the DC power source so as not to produce a longitudinal amplitude distortion in response to the switching operation of the first and second transistors.

10 Claims, 11 Drawing Figures

PULSE WIDTH MODULATED SIGNAL AMPLIFIER

BACKGROUND OF THE INVENTION

1. Field of the Invention

The present invention relates generally to a pulse width modulated (PWM) signal amplifier and is directed more particularly to a PWM signal amplifier with which longitudinal amplitude distortion is reduced.

2. Description of the Prior Art

Recently, pulse width modulated signal amplifiers have been used as audio output amplifiers in class D amplifiers. In such cases, since the PWM signal amplifier can perform a complete switching operation from a theoretical point of view, power consumption by the switching element is very small and hence the efficiency of the amplifier is improved.

There are circuits used in PWM amplifiers in which two transistors are connected in a complementary push-pull arrangement in series between the terminals of a DC power source. The connection point between the transistors is connected through a low pass filter, such as a choke coil, to a speaker. In such circuits, the discharging current of the choke coil is partially by-passed through diodes connected in parallel to the transistors to carry out a predetermined switching operation.

With the type of prior art circuit just described, when the transistors and diodes are biased to be conductive and nonconductive alternately, a type of amplitude distortion known as longitudinal amplitude distortion is produced in the waveform of the output pulse voltage. Such a defect is very disadvantageous for reducing the distortion of a class D amplifier.

SUMMARY OF THE INVENTION

In accordance with this invention a PWM signal amplifier is provided in which a pair of transistors are used as switching elements, a pair of diodes are connected in parallel to the emitter-collector paths of the transistors, respectively, and the connection point between the transistors and the diodes is connected through a low pass filter to a load to avoid longitudinal amplitude distortion of the output waveform produced by the switching operation of the switching transistors and diodes. The transistors each have base, emitter, and collector electrodes. The base electrodes of the transistors are supplied with a PWM signal to be amplified, the emitters are connected to each other and to an output terminal to be connected through a low pass filter to a load, and the collector electrodes are connected to the first and second terminals of a DC power source through first and second DC voltage sources, respectively. In addition, first and second diodes are connected between the common connection point of the emitter electrodes of the transistors and corresponding terminals of the DC power source, respectively, and first and second voltage limiting circuits are provided between the base electrodes of the first and second transistors and corresponding terminals of the DC power source so as not to produce a longitudinal amplitude distortion in response to the switching operation of the first and second transistors.

In a preferred embodiment, the first and second voltage limiting circuits comprise a series connection of plural diodes.

The features and advantages of the present invention will become more apparent from the following description taken in conjunction with the attached drawings.

DESCRIPTION OF THE PREFERRED EMBODIMENT

Figure 1:
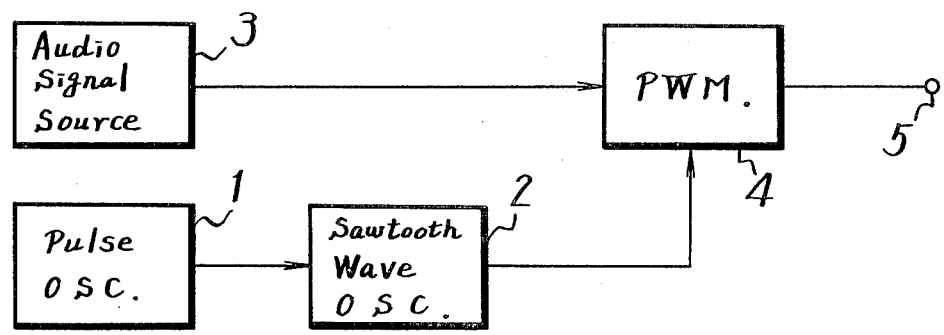
FIG. 1 is a block diagram showing an embodiment of the pulse width modulator used in the present invention.
Figure 2:
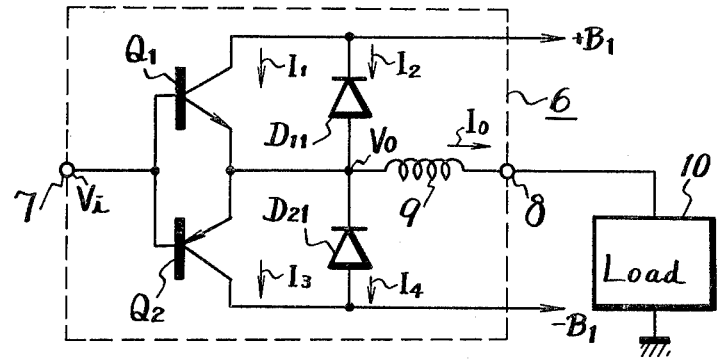
FIG. 2 is one example of basic PWM signal amplifiers used for explaining the present invention.

In FIG. 1 a pulse oscillator 1 is connected to a sawtooth wave oscillator 2 that produces a sawtooth wave signal having the same repetition rate as the pulse signal from the oscillator. A modulation signal source 3, such as an audio signal source, and the sawtooth wave oscillator 2 are both connected to a pulse width modulator 4, which then produces a PWM signal at its output terminal 5. The PWM signal thus obtained is applied to a class D amplifier (PWM amplifier), one embodiment of which is shown in FIG. 2 as amplifier 6. The class D amplifier has output transistors that operate at high efficiency, so that the non-linearity of its output transistors poses almost no problem and it is not required that the output transistors be uniform. The class D amplifier is widely used in circuits in which an auido signal is converted into a PWM signal and then amplified and thereafter the PWM signal is demodulated to return it to the condition of an original audio signal.

The fundamental circuit construction of the class D amplifier 6 in FIG. 2 includes an input terminal 7 connected directly to the bases of two connected transistors $Q_1$ and $Q_2$. The transistor $Q_1$ is an NPN type transistor while the transistor $Q_2$ is a PNP type transistor. The emitter electrodes of these transistors $Q_1$ and $Q_2$ are connected together to an output terminal 8 through a carrier elimination filter, or low pass filter, such as a choke coil 9. The output terminal 8 is connected to one end of a load 10, such as a loudspeaker or the like, and the other end of the load 10 is grounded. The collector electrodes of the transistors $Q_1$ and $Q_2$ are connected to opposite polarity terminals $+B_1$ and $-B_1$ of a DC power source (not shown). The PWM signal to be amplified is applied to the input terminal 7 from the pulse width modulator 4 shown in FIG. 1. Diodes $D_{11}$ and $D_{21}$ for by-passing reverse currents are connected between the common connection point of the emitters of the transistors $Q_1$ and $Q_2$ and the power source terminals $+B_1$ and $-B_1$, respectively. The anode of the diode $D_{11}$ is connected to the emitters of the transistors $Q_1$ and $Q_2$ and the cathode of this diode is connected to the collector of the transistor $Q_1$. The anode of the diode $D_{21}$ is connected to the collector of the transistor $Q_2$ and the cathode of the diode $D_{21}$ is connected to the emitter of the transistor $Q_2$.

Figure 3A:
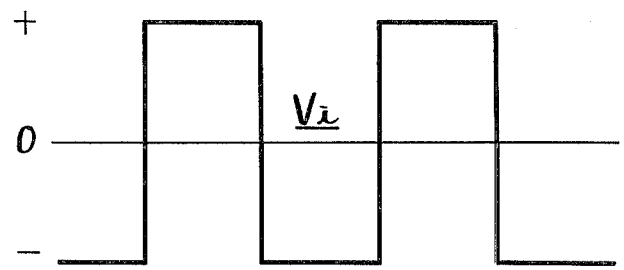
FIG. 3A through FIG. 3H are graphs showing waveforms in connection with the basic PWM signal amplifier shown in FIG. 2.
Figure 3B:
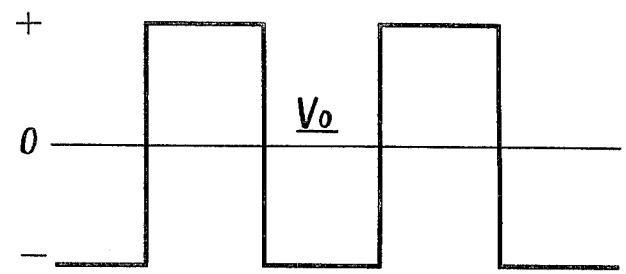
Figure 3C:
Figure 3D:
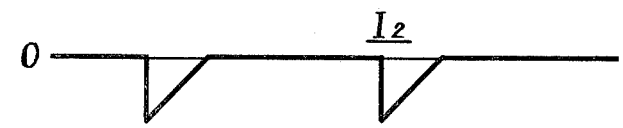
Figure 3E:
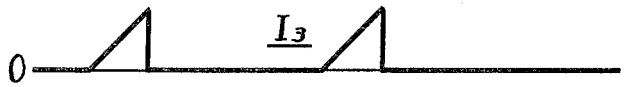
Figure 3F:
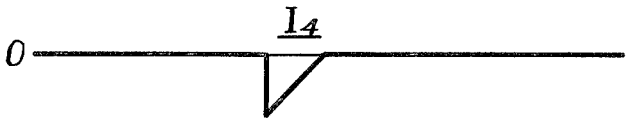

The operation of the PWM signal amplifier 6 shown in FIG. 2 will now be described with reference to signal waveforms in FIGS. 3A to 3H. FIG. 3A shows the waveform $Vi$ of the PWM signal applied to the input terminal 7 of the PWM signal amplifier 6. FIG. 3B shows the waveform $Vo$ of the output voltage obtained at the emitters of the transistors $Q_1$ and $Q_2$. Ideally, the waveform $Vo$ should be similar to the waveform $Vi$ of the input PWM signal, but amplitude distortion (which will be described later) is produced in the output waveform $Vo$. Still, it is easier to describe the operation as if the respective waveforms were ideal.

Figure 3G:
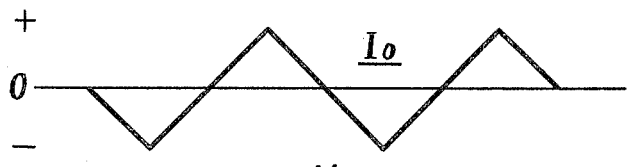

FIGS. 3C to 3F show, respectively, a current waveform $I_1$ which flows through the collector-emitter path of the transistor $Q_1$, a current waveform $I_2$ which flows through the diode $D_{11}$, a current waveform $I_3$ which flows through the emitter-collector path of the transistor $Q_2$ and a current waveform $I_4$ which flows through the diode $D_{21}$. The direction of the currents $I_1$, $I_2$, $I_3$ and $I_4$ are indicted in FIG. 2. As a result of these currents, a current $I_0$ flowing through the choke coil 9 has a triangle waveform and is composed of the currents $I_1$ to $I_4$, as shown in FIG. 3G.

The waveforms shown in FIGS. 3A to 3G are obtained when the pulse width modulated signal is not modulated. When the signal is modulated, the pulse width of the input signal $V_i$ shown in FIG. 3A is changed in response to the level of the modulating signal. The waveform signals shown in FIGS. 3B to 3G are, of course, also changed in response to the modulation.

Figure 3H:
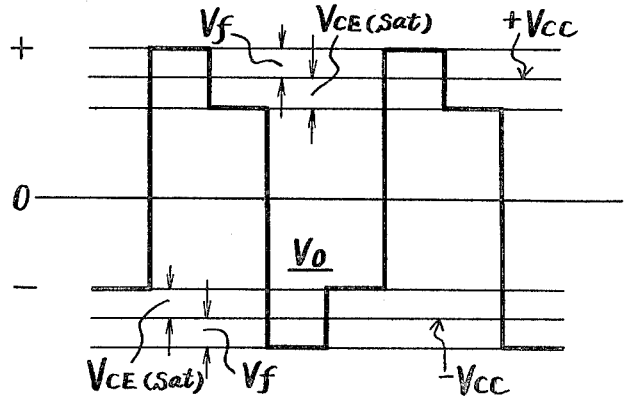

Examination of the waveform of the output voltage $V_0$ at the connection point between the emitter electrodes of the transistors $Q_1$ and $Q_2$ shown in FIG. 3B shows that the amplitude of the voltage waveform $V_0$ is not constant but that it fluctuates, as shown in FIG. 3H. That is, if it is assumed that the voltages at the power source terminals $+B_1$ and $-B_1$ are $+V_{CC}$ and $-V_{CC}$; the forward voltage drops of the diodes $D_{11}$ and $D_{21}$ are $V_f$; and the saturated voltages across the collector-emitter electrodes of the transistors $Q_1$ and $Q_2$ are $V_{CE(sat)}$, respectively, the levels or amplitude, of the output voltage $V_0$ becomes $(+V_{CC}+V_f)$ during the time that the current $I_2$ flows through the diode $D_{11}$. The level of the output voltage $V_0$ becomes $(+V_{CC}-V_{CE(sat)})$ during the time that the current $I_1$ flows through the transistor $Q_1$. Also, the level or amplitude of the voltage $V_0$ becomes $(-V_{CC}-V_f)$ while the current $I_4$ is flowing through the diode $D_{21}$ and becomes $(-V_{CC}+V_{CE(sat)})$ while the current $I_3$ flows through the transistor $Q_2$. The fact that the amplitude of the output voltage $V_0$ obtained by the PWM signal amplifier fluctuates causes a longitudinal amplitude distortion in the signal supplied to the load 10.

The present invention reduces or eliminates the fluctuation of the level of the output voltage and, hence, prevents the longitudinal amplitude distortion from being formed in a signal applied to the load 10.

An embodiment of the present invention will be described with reference to FIG. 4 in which the parts corresponding to those of FIG. 2 are marked with the same reference characters as those of FIG. 2. The description of such parts will not be repeated.

Figure 4:
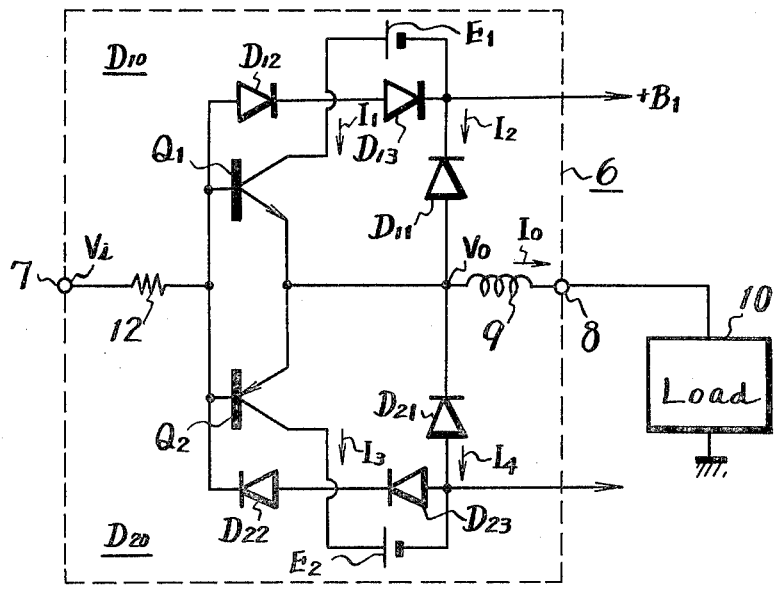
FIG. 4 is a circuit diagram showing an example of the PWM signal amplifier according to the present invention.

In the embodiment of the invention shown in FIG. 4, the negative electrode of a DC voltage source $E_1$, such as a battery, is connected to the cathode of the diode $D_{11}$ and the positive electrode of the source is connected to the collector electrode of the transistor $Q_1$. The negative electrode of a second DC voltage source $E_2$, such as another battery, is connected to the anode electrode of the diode $D_{21}$ and the positive electrode of the second source is connected to the collector electrode of the transistor $Q_2$. In FIG. 4 reference characters $D_{10}$ and $D_{20}$ generally designate rectifiers for controlling, or clamping, the voltage applied to the bases of the transistors $Q_1$ and $Q_2$. In the example of FIG. 4, the rectifier $D_{10}$ consists of diodes $D_{12}$ and $D_{13}$ connected in series and the rectifier $D_{20}$ consists of diodes $D_{22}$ and $D_{23}$ connected in series, respectively. The anode of the rectifier $D_{10}$ or diode $D_{12}$ is connected to the base of the transistor $Q_1$ and the cathode of the rectifier $D_{10}$ or the diode $D_{13}$ is connected to the power source terminal $+B_1$. The anode of the rectifier $D_{20}$ or diode $D_{23}$ is connected to the power source terminal $-B_1$ and the cathode of the rectifier $D_{20}$ or diode $D_{22}$ is connected to the base of the transistor $Q_2$. Further, a resistor 12 is connected between the input terminal 7 and the common connection point of the base of the transistors $Q_1$ and $Q_2$. The remainder of the circuit construction of the embodiment in FIG. 4 is substantially the same as that of FIG. 2.

The voltage of each of the DC voltage sources $E_1$ and $E_2$ is taken as $V_A$ and $V_A$ is selected to satisfy the following condition (1) so as to cause the transistors $Q_1$ and $Q_2$ to be fully conductive:

$$V_A \geq V_f + V_{CE(sat)} \qquad 1.$$

Where $V_f$ represents the forward voltage drop of either the diode $D_{12}$ or $D_{13}$.

The input voltage $V_i$ supplied to the input terminal 7 in this invention is selected to satisfy the following expression (2).

$$|V_i| \geq |V_{CC} + 2V_f| \qquad 2.$$

Further, the forward voltages of the rectifiers $D_{10}$ and $D_{20}$ are selected to make the reverse current blocking diodes $D_{11}$ and $D_{21}$ conductive by virtue of the emitter potentials of the transistors $Q_1$ and $Q_2$ when the transistors become conductive.

The operation of the PWM signal amplifier of the present invention shown in FIG. 4 will now be described, particularly with respect to improvements over the fundamental operation of the circuit shown in FIG. 2.

Firstly, it is assumed that the input voltage $V_i$ shown in FIG. 3A is positive. If the current $I_0$ is positive, the output voltage $V_0$ at the connection point of the emitter electrodes of the transistors $Q_1$ and $Q_2$ is expressed as follows:

$$V_0 = V_{CC} = 2V_f - V_{BE} = V_{CC} + V_f \qquad 3.$$

where $V_f$ is taken equal to $V_{BE}$, which is the voltage across the base-emitter electrodes of either of the transistors $Q_1$ or $Q_2$.

If the current $I_0$ is negative, since the diode $D_{11}$ is conductive, the output voltage $V_0$ is expressed as follows:

$$V_0 = V_{CC} + V_f \qquad 4.$$

From equations (3) and (4), it will be easily understood that if the input voltage $V_i$ is positive, the output voltage $V_0$ will have the constant value $(V_{CC}+V_f)$ whether the current $I_0$ is positive or negative. Similarly, when the input voltage $V_i$ is negative, the output voltage $V_0$ has the constant value $(-V_{CC}-V_f)$ whether the current $I_0$ is positive or negative.

The voltage $V_A$ of each of the DC voltage sources $E_1$ and $E_2$ is selected to be equal to $(V_f + V_{CE(sat)})$, and the power consumption in the PWM signal amplifier is small. As the voltage $V_A$ becomes greater than $V_f + V_{CE(sat)}$, the transistors $Q_1$ and $Q_2$ can be held in their operative region to avoid time fluctuation caused by the storage time of the transistors and to make their high speed switching possible. However, if the voltage $V_A$ is selected to be large, the power consumption increases substantially.

In a PWM signal amplifier according to the present invention described above, the PWM signal is supplied to the bases of the first and second transistors; their emitters are connected together to the load through the carrier, eliminating a filter or low pass filter. The emitters are also connected to the first and second main power source terminals to achieve different characteristics through the reverse current diodes. The first and second main power source terminals are connected through the first and second DC voltage sources to the collectors of the first and second transistors; the respective bases of the first and second transistors are connected through the first and second voltage controlling, or clamping, diodes to the first and second main power source terminals, and the voltage of the first and second DC voltage sources is selected to be greater than the sum of the forward voltage of the first and second reverse current diodes and the saturation voltage across the collector-emitter electrodes of the first and second transistors. Thus, the output voltage obtained from the PWM signal amplifier of the present invention has no longitudinal amplitude distortion and has therefore a constant amplitude. As a result, the current supplied to the load by the output voltage has no distortion for the original modulation signal of the PWM signal.

It may be apparent that many modifications and variations could be effected by one skilled in the art without departing from the spirit and scope of the novel concepts of the present invention.

What is claimed is:

1. A pulse width modulated signal amplifier comprising:
   A. a DC power source having first and second terminals;
   B. first and second transistors each having a base, an emitter, and a collector, each of said bases being supplied with a pulse width modulated signal to be amplified and said emitters being connected together at a common connection point;
   C. an output terminal connected to said emitters;
   D. a load;
   E. a low pass filter connecting said output terminal to said load;
   F. first connecting means connecting the first terminal of said DC power source to the collector electrode of said first transistor;
   G. second connecting means connecting the second terminal of said DC voltage source to the collector electrode of said second transistor;
   H. first and second diodes, said first diode being connected between the first terminal of said DC power source and the common emitter connection point of said first and second transistors and said second diode being connected between the second terminal of said DC power source and said common emitter connection point; and
   I. first and second voltage limiting means, said first voltage limiting means being connected between the base electrode of said first transistor and the first terminal of said DC power source, said second voltage limiting means being connected between the base electrode of said second transistor and the second terminal of said DC power source, whereby said first and second transistors are free from a longitudinal amplitude distortion in response to their switching operations.

2. A pulse width modulated signal amplifier according to claim 1 in which said first connecting means includes a first DC voltage source and said second connecting means includes a second DC voltage source.

3. A pulse width modulated signal amplifier according to claim 2 in which each of said voltage limiting means comprises a plurality of series connected diodes, respectively.

4. A pulse width modulated signal amplifier according to claim 3 in which said low pass filter comprises a choke coil.

5. A pulse width modulated signal amplifier according to claim 2 in which said first and second transistors are connected in complementary push-pull relationship between first and second terminals of said DC power source.

6. A pulse width modulated signal amplifier according to claim 5 in which said first transistor is of NPN type conductivity and said second transistor is of PNP type conductivity.

7. A pulse width modulated signal amplifier according to claim 2 in which each of said first and second DC voltage sources comprises a battery.

8. A pulse width modulated signal amplifier according to claim 7 in which each of said first and second voltage limiting means comprises two diodes connected in series and the peak voltage of the output voltage $V_0$ produced at the common emitter connection point is kept constant and is determined by the following equation:

$$V_0 = V_{cc} + V_f$$

where $V_{CC}$ is the voltage of the first or second terminal of said DC power source and $V_f$ is the forward voltage drop of one of said diodes.

9. A pulse width modulated signal amplifier according to claim 8 in which each voltage $V_A$ of said first and second DC voltage sources is determined by the following expression:

$$V_A \geqq V_f + V_{CE}(\text{sat})$$

where $V_f$ indicates the forward voltage drop across one of said serially connected diodes and $V_{CE(sat)}$ indicates the saturation voltage of one of said transistors.

10. A pulse width modulated signal amplifier according to claim 9 in which the voltage $V_i$ of said pulse width modulated signal to be applied to the base electrodes of said first and second transistor is determined by the following equation:

$$|V_i| \geqq |V_{cc} + 2V_f|$$

where $V_{CC}$ indicates the voltage of the first or second terminal of said DC power source and $V_f$ indicates the forward voltage drop across one of said serially connected diodes.

* * * * *